(12) United States Patent
Min

(10) Patent No.: US 7,772,664 B2
(45) Date of Patent: Aug. 10, 2010

(54) CMOS IMAGE SENSOR

(76) Inventor: Woo Sig Min, 109-1201, Shinhan Apt., 94-3, Jeungpo-dong, Icheon-si, Kyoungki-do (KR)

( * ) Notice: Subject to any disclaimer, the term of this patent is extended or adjusted under 35 U.S.C. 154(b) by 1137 days.

(21) Appl. No.: 11/110,488

(22) Filed: Apr. 20, 2005

(65) Prior Publication Data
US 2005/0258462 A1 Nov. 24, 2005

(30) Foreign Application Priority Data
May 14, 2004 (KR) ................... 10-2004-0034144

(51) Int. Cl.
*H01L 31/033* (2006.01)
*G02B 27/10* (2006.01)

(52) U.S. Cl. .............. 257/432; 257/435; 257/232; 358/619; 358/621

(58) Field of Classification Search .......... 257/432, 257/435, 232, 233, 438; 359/619, 621, 622; 358/482
See application file for complete search history.

(56) References Cited

U.S. PATENT DOCUMENTS

| | | | | |
|---|---|---|---|---|
| 5,239,412 A | * | 8/1993 | Naka et al. | 359/619 |
| 6,221,687 B1 | * | 4/2001 | Abramovich | 438/70 |
| 6,274,917 B1 | * | 8/2001 | Fan et al. | 257/432 |
| 6,362,498 B2 | * | 3/2002 | Abramovich | 257/233 |
| 6,583,438 B1 | * | 6/2003 | Uchida | 257/59 |
| 6,946,352 B2 | * | 9/2005 | Yaung | 438/296 |
| 6,970,273 B1 | * | 11/2005 | Inoue | 358/3.02 |
| 7,068,432 B2 | * | 6/2006 | Boettiger et al. | 359/619 |

FOREIGN PATENT DOCUMENTS

| KR | 2000044582 | * | 7/2000 |
|---|---|---|---|
| KR | 1020000044582 A | | 7/2000 |

* cited by examiner

*Primary Examiner*—Wael Fahmy
*Assistant Examiner*—Shrininvas H. Rao
(74) *Attorney, Agent, or Firm*—McAndrews, Held & Malloy, Ltd

(57) ABSTRACT

Disclosed is a CMOS image sensor, which can minimize a reflectance of light at an interface between a photodiode and an insulating film, thereby enhancing image sensitivity. Such a CMOS image sensor includes a substrate provided with a photodiode consisting of Si, an insulating film consisting of $SiO_2$ and formed on the substrate, an anti-reflection film interposed between the substrate and the insulating film, and metal interconnections, color filters and micro lenses constituting individual unit pixels. The semi-reflection film has a refraction index value between those of the Si photodiode and the $SiO_2$ insulating film.

8 Claims, 1 Drawing Sheet

CMOS IMAGE SENSOR

BACKGROUND OF THE INVENTION

1. Field of the Invention

The present invention relates generally to a CMOS image sensor, and more particularly to a CMOS image sensor, which can minimize a reflectance of light at an interface between a photodiode and an insulating film, thereby enhancing image sensitivity thereof.

2. Description of the Prior Art

A CMOS image sensor includes a plurality of pixels, each of which consists of several transistors for various purposes and one photodiode. In such a CMOS image sensor, first of all, light transmits the photodiode made of Si while exciting holes formed in the photodiode to generate electrical signals and then the electrical signals are converted into an image.

It is ideal that 100% of light reaches the photodiode, but an area ratio occupied by the photodiode per pixel is reduced to 30% or less as a pixel size becomes smaller and smaller due to the requirement for high picture quality. That is, only 30% or less of actual incident light can enter into the photodiode. For this reason, there is employed a method in which a micro lens is formed above each pixel to focus 90% of light on the photodiode.

Meanwhile, since multilayer metal interconnections are formed above the photodiode and the transistors, light incident through the micro lens passes multilayer insulating films and then arrives at the photodiode. In this course, light does not transmit the insulating films by 100%, but is reflected to a certain extent. The larger a difference between refraction indices of materials is, the more light is reflected. In general, places where reflection occurs most frequently are an interface between a photodiode, a kind of doped silicon, and a SiO2 based insulating film. A reflectance at such an interface amounts to about 15% as shown below in Table 1.

Table 1 shows a reflectance at the interface between the photodiode made of Si and the SiO2 based insulating film used above the photodiode. Here, it can be seen that the photodiode has a refraction index (n) of 3.4 and the insulating film used above the photodiode has a refraction index (n) of 1.5.

TABLE 1

| Material | n | Reflectance |
|---|---|---|
| Si | 3.4 | |
| SiO2 | 1.5 | 0.150354019 |
| Total reflectance | | 15.04 |

An alternative proposal to reduce the reflectance to 15% or less employs a structure in which a semi-reflection film of SiN having a refraction index of 2.1 is coated between the photodiode and the insulating film, which results in a reflectance of about 8%. However, even if such a structure is employed, there is still a problem in that the sum of reflectance values occurring at an interface between the micro lens and the insulating film or between every two layers of the multilayer insulating films brings about a loss of at least 10%.

SUMMARY OF THE INVENTION

Accordingly, the present invention has been made to solve the above-mentioned problems occurring in the prior art, and an object of the present invention is to provide a CMOS image sensor, which enable light incident through a micro lens to reach a photodiode consisting of Si as much as possible by interposing a anti-reflection film having a refraction index value between those of the Si photodiode and a first insulating film consisting of $SiO_2$ at an interface between the SI photodiode and the $SiO_2$ first insulating film, that is, a place where the greatest loss of light occurs, to minimize a reflectance at the interface.

In order to accomplish this object, there is provided a CMOS image sensor comprising: a substrate being provided with a photodiode consisting of Si; an insulating film consisting of SiO2 and being formed on the substrate; a semi-reflection film being interposed between the substrate and the insulating film and having a refraction index value between those of the Si photodiode and the SiO2 insulating film; and metal interconnections, color filters and micro lenses constituting individual unit pixels.

Any one single film selected from the group consisting of diamond, SiC and SiNx may be used as the anti-reflection film. Here, when a diamond single film is used as the anti-reflection film it has a refraction index value of 2.5 to 3.4 and a thickness of 100 to 5000 Å. Similarly, a SiC single film to be used as the anti-reflection film has a refraction index value of 2.5 to 3.4. Also, a SiNx single film to be used as the anti-reflection film has a refraction index value of 1.9 to 2.4 and a thickness of 100 to 5000 Å.

The semi-reflection film may be formed in a double film structure of SiNx/SiOxN1-x (0<x<1). Here, the SiOxN1-x film has a refraction index value of 1.5 to 2.1 and a thickness of 100 to 5000 Å.

The anti-reflection film may be formed in any one structure of SiC/SiNx and SiCx/SiNxC1-x/SiOxN1-x. Here, the SiNxC1-x/SiOxN1-x film has a gradient refraction index value continuously varying between 1.5 and 3.4 and a thickness of 100 to 5000 Å.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
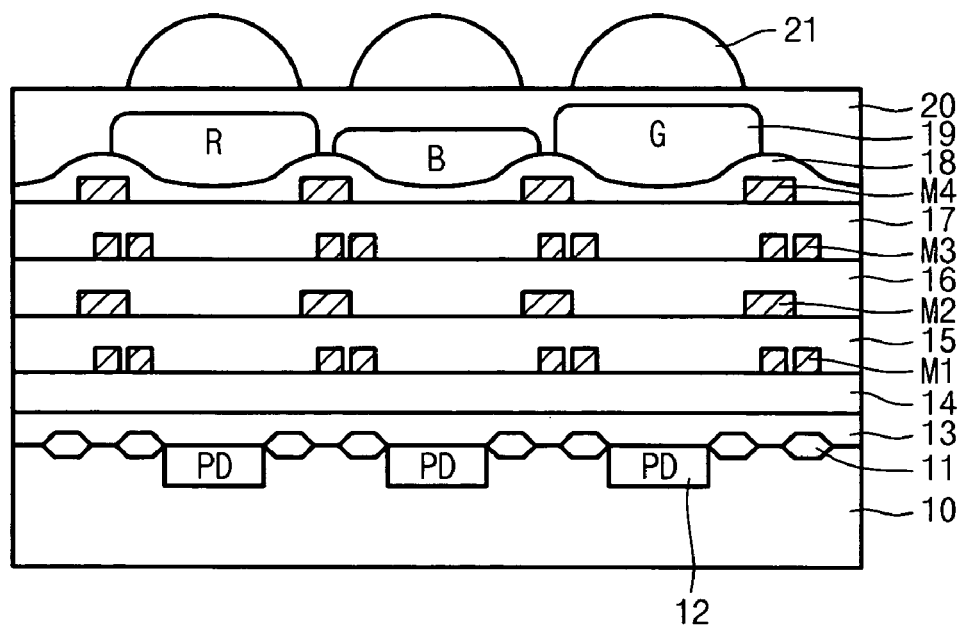
FIG. 1 is a sectional view for explaining process-by-process structures of a CMOS image sensor in accordance with a preferred embodiment of the present invention.

Hereinafter, preferred embodiments of the present invention will be described with reference to the accompanying drawings. In the following description and drawings, the same reference numerals are used to designate the same or similar components, and so repetition of the description on the same or similar components will be omitted.

Figure 2:
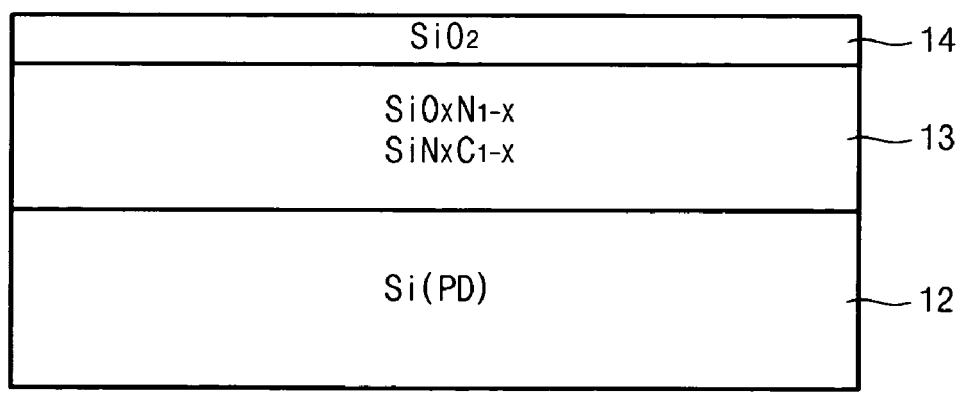
FIG. 2 is a sectional view showing a photodiode/semi-reflection film/insulating film structure in the CMOS image sensor according to present invention.

FIG. 1 illustrates a sectional view for explaining process-by-process structures of a CMOS image sensor in accordance with a preferred embodiment of the present invention, and FIG. 2 illustrates a sectional view showing a photodiode/semi-reflection film/insulating film structure in the CMOS image sensor according to present invention.

As shown in FIG. 1, the CMOS image sensor according to the present invention includes a substrate 10 provided with photodiodes 12 consisting of Si and device separating films 11, a first insulating film 14 formed on the substrate 10, a semi-reflection film 13 interposed between the photodiode 12 and the first insulating film 14, first metal interconnections M1 formed on the first insulating film 14, a second insulating film 15 formed on the first insulating film 14 including the first metal interconnections M1, second metal interconnections M2 formed on the second insulating film 15, a third insulating film 16 formed on the second insulating film 15 including the second metal interconnections M2, third metal interconnections M3 formed on the third insulating film 16, a fourth insulating film 17 formed on the third insulating film 16 including the third metal interconnections M3, fourth metal interconnections M4 formed on the fourth insulating film 17, a fifth insulating film 18 formed on the fourth insulating film 17 including the fourth metal interconnections M4, RGB color filters 19 formed on the fifth insulating film 18, a planarizing film 20 covering the respective color filters 19, and micro lenses 21 formed on the planarizing film 20.

The semi-reflection film 13 has a refraction index value between those of the Si photodiode 12 and the $SiO_2$ first insulating film 14. Since the SI photodiode 12 and the $SiO_2$ first insulating film 14 have refraction index values of 3.4 and 1.5. respectively, the refraction index value of the anti-reflection film 13 according to the present invention corresponds to a value of 1.5 to 3.4.

As material of the anti-reflection film 13, (1) any one single film of diamond, SIC and SiNx, (2) any one double film of SiNx/SiOxN1-x (0<x<1), or (3) any one film of SiCx/SiNx and SiCx/SiNxC1-x/SiOxN1-x (shown in FIG. 2) may be used.

When the single film structure is employed as the anti-reflection film 13 (corresponding to (1)), the anti-reflection film 13 has (1) a refraction index value of 2.5 to 3.4 and a thickness of 100 to 5000 Å in a case of using a diamond single film, (b) a refraction index value of 2.5 to 3.4 in a case of using a SiC single film, or (3) a refraction index value of 1.9 to 2.4 and a thickness of 100 to 5000 Å in a case of using a SiNx single film.

When the double film structure is employed as the anti-reflection film 13 (corresponding to (2)), the film has a refraction index value of 1.9 to 2.4 and a thickness of 100 to 5000 Å.

When the any one structure of a single composition SiC/SiNx film and a SiCx/SiNxC1-x/SiOxN1-x film is employed as the anti-reflection film 13 (corresponding to (3)), in particular, the SiNxC1-x/SiOxN1-x film has a refraction index value continuously varying between 1.5 and 3.4 and a thickness of 100 to 100 Å.

Hereinafter, a description will be given for a method for forming a CMOS image sensor in accordance with a preferred embodiment of the present invention.

First of all, device separating films 11 for electrical insulation between devices are formed on a semiconductor substrate 10. At this time, the device separating films 11 may be formed using a Local Oxidation Of Silicon (LOCOS) method and may have a trench structure.

Thereafter, a gate electrode (not shown) is formed on the substrate 10 including the device separating films 11 and then an ion implantation process progresses to form photodiodes 12 consisting of Si and ion implantation for forming sources/drains of transistors and sensing nodes is also performed.

Next, a semi-reflection film 13 and a first insulating film 14 are successively deposited on the whole structure including the device separating films 11 and the photodiodes 12.

With respect to this, (1) when a diamond single film is used as the semi-reflection film 13, the diamond single film is formed by a Chemical Vapor Deposition (CVD) method using plasma. When a SiC single film is used as the semi-reflection film 13, the SiC single film is formed using a CVD or Plasma Enhanced Chemical Vapor Deposition (PECVD) method. When a SiN single film is used as the semi-reflection film 13, the SiNx single film has a refraction index value of 1.9 to 2.4 and preferably a refraction index value of 2.1 in a case of x=1 as shown below in Table 2.

TABLE 2

| Material | N | Reflectance |
|---|---|---|
| Si | 3.4 | |
| SiN | 2.1 | 0.055867769 |
| SiO2 | 1.5 | 0.027777778 |
| Total reflectance | | 8.36 |

Table 2 shows reflectance values when the photodiode/semi-reflection film/first insulating film has a Si/SiN/SiO2 structure (where, n designates a refraction index value).

(2) When a SiNx/SiOxN1-x double film is used as the anti-reflection film 13, the SiOxN1-x film is formed using a CVD or PECVD method while a ratio of a nitrogen source (NH3) and an oxygen source (TEOS) is continuously changed with the passage of time. Here, a single composition film or a film having a composition continuously varying within a range of 0<x–1 can be used as the SiOxN1-x film.

(3) When a single composition SiC/SiNx film a SIC/SiNx film having a variable composition or a SiCx/SiNxC1-x/SiOxN1-x film is used as the semi-reflection anti-reflection 13, in particular, in a case of using a single composition SiC/SiN (x=1) film, SiC has a refraction index value of 2.4 and SiN has a refraction index value of 2.1 as shown below in Table 3.

TABLE 3

| Material | N | Reflectance |
|---|---|---|
| Si | 3.4 | |
| SiC | 2.4 | 0.029726516 |
| SiN | 2.1 | 0.004444444 |
| SiO2 | 1.5 | 0.027777778 |
| Total Reflectance | | 3.22 |

Table 3 shows reflectance values when the photodiode/semi-reflection film/first insulating film has a Si/SiC/SiN/SiO2 structure (where, n designates a refraction index value).

In case of using the SiCx/SiNxC1-x/SiOxN1-x as the anti-reflection film (shown in FIG. 2), the SiCx/SiNxC1-x/SiOxN1-x film is formed using a CVD or PECVD method while quantities of reaction gases are so adjusted as to continuously change the composition as SiC→SiN→SiOx.

Next, first, second, third and fourth metal interconnections M1, M2, M3, M4 constituting unit pixels are formed on the first insulating film 14. At this time, the first, second, third and fourth metal interconnections M1, M2, M3, M4 are disposed such that they do not interrupt light entering into the photodiodes 12. Also, second, third, fourth and fifth insulating films 15, 16, 17, 18 are formed between every two layers of the metal interconnections M1, M2, M3, M4 constituting individual unit pixels.

Next, red, blue and green color filters 19 are formed on the fifth insulating film 18, respectively and a planarizing film 20 is so formed as to cover the color filters 19. Finally, a micro lens 21 is fabricated on the planarizing film 20.

As described above, according to a CMOS image sensor of the present invention, a semi-reflection film having a refraction index value between those of a photodiode consisting of Si and a first insulating film consisting of SiO2 is interposed at an interface between the Si photodiode and the SiO2 first insulating film, that is, a place where the greatest loss of light occurs, to minimize a reflectance at the interface, so that the image sensor enabling light incident through a micro lens to reach the Si photodiode as much as possible.

Accordingly, the present invention can be applied to a CMOS image sensor of a million-pixel-grade or a higher pixel-grade for realizing images of high picture quality.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A CMOS image sensor comprising:
    a substrate having a Si photodiode;
    a $SiO_2$ insulating film formed on the substrate;
    an anti-reflection film being interposed between the Si photodiode and the $SiO_2$ insulating film and having a gradient refraction index value varying between the respective refractive indexes of the Si photodiode and the $SiO_2$ insulating film; and
    metal interconnections, color filters and micro lenses constituting individual unit pixels.

2. The CMOS image sensor of claim 1, wherein the anti-reflection film comprises a single film consisting of diamond or SiC, wherein the gradient refraction index value of the anti-reflection film varies as a stepped gradient function.

3. The CMOS Image sensor claim 2, wherein the diamond single film has a refraction index value of about 2.5 to about 3.4 and has a thickness of about 100 Å to about 5000 Å.

4. The CMOS image sensor of claim 2, wherein the SiC single film has a refraction index value of about 2.5 to about 3.4.

5. The CMOS image sensor of claim 1, wherein the anti-reflection film comprises a double film structure of $SiN_x/SiO_xN_{1-x}$ ($0<x<1$).

6. The CMOS image sensor of claim 5, wherein the film structure of the $SiN_x/SiO_xN_{1-x}$ anti-reflection film has a gradient refraction index value continuously varying between about 1.5 to about 2.1 and having a thickness of about 100 to about 5000 Å.

7. The CMOS image sensor of claim 1, wherein the anti-reflection films has any one structure selected from the group consisting of $SiC/SiN_x$ with a single composition and $SiC_x/SiN_xC_{1-x}/SiO_xN_{1-x}$ with a composition continuously varying within a range of $0<x<1$.

8. The CMOS image sensor of claim 7, wherein the $SiC_x/SiN_xC_{1-x}/SiO_xN_{1-x}$ film has a gradient refraction index value continuously varying between about 1.5 and about 3.4 and a thickness of about 100 Å to about 5000 Å.

* * * * *